(12) United States Patent
Choi et al.

(10) Patent No.: US 8,143,611 B2
(45) Date of Patent: Mar. 27, 2012

(54) PHASE-CHANGE MEMORY ELEMENT, PHASE-CHANGE MEMORY CELL, VACUUM PROCESSING APPARATUS, AND PHASE-CHANGE MEMORY ELEMENT MANUFACTURING METHOD

(75) Inventors: Young-suk Choi, Tama (JP); Koji Tsunekawa, Hachioji (JP)

(73) Assignee: Canon Anelva Corporation, Kanagawa-ken (JP)

( * ) Notice: Subject to any disclaimer, the term of this patent is extended or adjusted under 35 U.S.C. 154(b) by 0 days.

(21) Appl. No.: 12/872,497

(22) Filed: Aug. 31, 2010

(65) Prior Publication Data

US 2010/0328997 A1    Dec. 30, 2010

Related U.S. Application Data

(63) Continuation of application No. PCT/JP2008/061152, filed on Jun. 18, 2008.

(51) Int. Cl.
*H01L 45/00* (2006.01)
(52) U.S. Cl. ............ 257/4; 257/3; 257/5; 257/E45.001; 365/148; 438/95; 438/900
(58) Field of Classification Search .................. 257/1–5, 257/E45.001–E45.003; 365/148; 438/95, 438/900
See application file for complete search history.

(56) References Cited

U.S. PATENT DOCUMENTS

| | | | |
|---|---|---|---|
| 3,271,591 | A | 9/1966 | Ovshinsky |
| 3,530,441 | A | 9/1970 | Ovshinsky |
| 7,023,008 | B1 | 4/2006 | Happ |
| 7,033,008 | B2 | 4/2006 | Silverbrook et al. |
| 7,893,420 | B2 | 2/2011 | Liang et al. |
| 2003/0219924 | A1 | 11/2003 | Bez et al. |
| 2004/0026731 | A1 | 2/2004 | Fournier et al. |
| 2004/0192006 | A1 | 9/2004 | Campbell et al. |

(Continued)

FOREIGN PATENT DOCUMENTS

CN    101393964 A    3/2009
(Continued)

OTHER PUBLICATIONS

International Search Report (PCT/ISA/210) issued on Aug. 12, 2008, by Japanese Patent Office as the International Searching Authority for International Application No. PCT/JP2008/061152.

(Continued)

*Primary Examiner* — Anh Phung
*Assistant Examiner* — Michael Lulis
(74) *Attorney, Agent, or Firm* — Buchanan Ingersoll & Rooney PC

(57) ABSTRACT

A phase-change memory element includes a perovskite layer formed by a material having a perovskite structure, and a phase-change recording material layer which is formed on the perovskite layer, and changes the phase to a crystal state or amorphous state when supplied with an electric current via the perovskite layer.

4 Claims, 12 Drawing Sheets

U.S. PATENT DOCUMENTS

| | | | |
|---|---|---|---|
| 2004/0195613 | A1 | 10/2004 | Kweon |
| 2006/0113573 | A1 | 6/2006 | Cheong et al. |
| 2006/0266992 | A1 | 11/2006 | Matsui et al. |
| 2007/0007506 | A1 | 1/2007 | Campbell et al. |
| 2007/0170413 | A1 | 7/2007 | Matsui et al. |
| 2008/0278865 | A1 | 11/2008 | Tsunekawa et al. |
| 2009/0032056 | A1 | 2/2009 | Tsunekawa |
| 2009/0078924 | A1* | 3/2009 | Liang et al. ............... 257/3 |
| 2010/0044672 | A1 | 2/2010 | Matsui et al. |
| 2011/0140066 | A1 | 6/2011 | Liang et al. |

FOREIGN PATENT DOCUMENTS

| | | |
|---|---|---|
| JP | 2003-174144 A | 6/2003 |
| JP | 2006-352082 A | 12/2006 |
| JP | 2007-533136 A | 11/2007 |
| WO | WO 2005/112118 A1 | 11/2005 |

OTHER PUBLICATIONS

Written Opinion (PCT/ISA/237) issued on Aug. 12, 2008, by Japanese Patent Office as the International Searching Authority for International Application No. PCT/JP2008/061152.

Written Opinion of the International Preliminary Examining Authority (PCT/IPEA/409) issued on Jun. 30, 2009, by Japanese Patent Office for International Application No. PCT/JP2008/061152.

Ching-Chyuan Yang et al., Preparation of (100)-oriented metallic $LaNiO_3$ thin films on Si substrates by radio frequency magnetron sputtering for the growth of textured $Pb(Zr_{0.53}Ti_{0.47})O_3$, Appl. Phys. Lett. 66 (20, May 15, 1995, pp. 2543-2545.

Yuichi Matsui et al., $Ta_2O_5$ Interfacial Layer between GST and W Plug enabling Low Power Operation of Phase Change Memories, The Institute of Electronics, Information and Communication Engineers, IEICE Technical Report, vol. 106, No. 593, pp. 1-6.

Naoki Wakiya et al., Low-temperature epitaxial growth of conductive $LaNiO_3$ thin films by RF magnetron sputtering, Thin Solid Films, 410, 2002, pp. 114-120.

Official Action issued on Jul. 20, 2011 by the Chinese Patent Office in corresponding Chinese Patent Application No. 200880124911.8, and English language translation of the Official Action.

* cited by examiner

US 8,143,611 B2

PHASE-CHANGE MEMORY ELEMENT, PHASE-CHANGE MEMORY CELL, VACUUM PROCESSING APPARATUS, AND PHASE-CHANGE MEMORY ELEMENT MANUFACTURING METHOD

RELATED APPLICATION

This application claims priority as a continuation application under 35 U.S.C. §120 to PCT/JP2008/061152, which was filed as an International Application on Jun. 18, 2008 designating the U.S. The entire contents of this application is hereby incorporated by reference in its entirety.

TECHNICAL FIELD

The present invention relates to a phase-change memory element, phase-change memory cell, vacuum processing apparatus, and phase-change memory element manufacturing method.

BACKGROUND ART

Semiconductor memory elements are classified into two fields, that is, a volatile memory and nonvolatile memory, and both the memories require continuous power supply in order to hold data. A flash memory as a typical example of the nonvolatile memory requires no electric power to hold data. For this reason, flash memory is most frequently used as nonvolatile memory. As micropatterning of flash memory advances, however, recently a nonvolatile memory technique including more advanced micropatterning, speed, and reliability has been proposed instead of the flash memory.

A phase-change memory element as one next-generation technique is an electrically driven, low-power-consumption memory element capable of direct overwrite and rapid switching. Rapid switching between set and reset as two resistance value states of the phase-change memory element is caused by a large electrical characteristic change between the crystal phase and amorphous phase of a phase-change recording material. An example of the phase-change recording material is a chalcogenide material layer that largely changes the voltage by a phase change. The resistance states of these two phases have $10^2$ or more resistance changes for $10^{12}$ times of write, and the write count durability of the phase-change memory element, that is, the write count durability of the flash memory, is larger than $10^5$. In addition, since low power consumption, low voltage driving, and a logic circuit are achieved at the same time, the phase-change memory element is well suited for the field of mobile techniques. An example of most general materials of the chalcogenide material layer of the phase-change memory element is $Ge_2Sb_2Te_5$ (to be referred to as "GST" hereinafter). The basic concepts of electrically programmable phase-change memory element techniques are disclosed in, for example, patent references 3 and 4.

The structure and operation of the phase-change memory element will be explained below with reference to FIGS. 5 to 9. FIGS. 5 and 6 are exemplary sectional views respectively showing the structures of the conventional phase-change memory element in the crystal phase and amorphous phase.

FIG. 7 is a view showing the relationship between the electrical pulse time and the temperature when crystallizing and amorphizing the phase-change memory element.

FIG. 8 is an exemplary view showing the crystal structure of the chalcogenide material layer in the crystal state. A phase-change memory cell has one selector (selection transistor) and one phase-change memory element (including a chalcogenide material layer). As shown in FIG. 5, a chalcogenide material layer 707 is sandwiched between an upper electrode 708 and plug 705. The plug 705 extends through a lower insulating layer 704, and electrically connects the chalcogenide material layer 707 and a selection transistor 703. Data is written in the phase-change memory element by Joule heat generated by heating the chalcogenide material layer 707 to a temperature greater than or equal to the melting point.

After that, as shown in FIG. 6, the melted metal is rapidly cooled, and this amorphizes a portion 706, which covers the plug 705, of the chalcogenide material layer 707. This is the transition from set to reset. The opposite transition is achieved by an electrical pulse applied at a lower temperature for a longer time. Joule heat generated by this electrical pulse heats the chalcogenide material layer 707 to a temperature lower than the melting point and much higher than the temperature required for the amorphous-crystallization transition for a few hundred nanoseconds. FIG. 7 is a view showing the set-reset transition described above by the relationship between the time and temperature. Note that the chalcogenide material layer 707 in the crystal phase takes two structures, that is, a stable hexagonal structure and metastable rock salt (NaCl) structure.

As shown in FIG. 8, it is recently reported that the chalcogenide material layer 707 is almost the same as a metastable body-centered-cubic structure in the amorphous phase. This means that an interatomic bond is weak in the chalcogenide material layer 707 in the amorphous phase. Although the interatomic bond is weak, the covalent bond is not broken, and an atom has definitely not moved from its position in the lattice. A face-centered-cubic structure of Te and a local structure around Sb are partially maintained, and this leads to rapid reliable recovery to the crystal phase. In the set-reset transition as described above, the chalcogenide material layer 707 in the crystal phase is presumably a metastable rock salt structure obtained by rapid crystallization of the metastable state.

A read operation of the phase-change memory element is performed as follows.

When the selection transistor 703 is turned on, a source 701b to drain 701a path is energized, and an electric current flows through the chalcogenide material layer 707 from the drain 701a. The magnitude of this electric current changes in accordance with the difference between the electrical resistance values of the crystal phase and amorphous phase of the chalcogenide material layer. By using this difference between the electrical resistance values, a value stored in the phase-change memory element can be read out as "0" or "1". The phase-change memory element having the structure as described above has the following problems, and various countermeasures have been made in recent years.

First, adhesion between the lower insulating layer 704 and chalcogenide material layer 707 is weak. In the phase-change memory element as described above, a thermal stress is applied by Joule heat during the transition between the crystal phase and amorphous phase. In this state, weak adhesion between the lower insulating layer 704 and chalcogenide material layer 707 is a serious problem. To solve this problem, a method by which an adhesion promoting layer 711 for reinforcing and promoting adhesion between the lower insulating layer 704 and chalcogenide material layer 707 is inserted below the chalcogenide material layer 707 as shown in FIG. 9 has been proposed. The disclosed adhesion promoting layer 711 is made of Ti-rich TiN (patent reference 8).

Amorphization is promoted, however, because a very low electrical resistivity of about $2.5 \times 10^{-7}$ $\Omega$m of TiN heats the chalcogenide material layer 707. As shown in FIG. 9, a portion 906 amorphized in the reset transition spreads over the entire surface of the chalcogenide material layer 707 in contact with the adhesion promoting layer 711. Accordingly, high electric power is required for the set-reset transition when compared to the case in which the portion 706 of the chalcogenide material layer 707 is amorphized as in the conventional structure shown in FIG. 6.

To solve the problems of power consumption and adhesion, the adhesion promoting layer 711 selected from $TiO_x$, $ZrO_x$, $HfO_x$, $TaO_x$, $NbO_x$, $CrO_x$, $WO_x$, and $Al_x$ has been proposed (patent reference 1).

Non-patent reference 3 has disclosed that $Ta_2O_5$ used as the adhesion promoting layer 711 of the phase-change memory element functions not only as the adhesion promoting layer but also as a thermal diffusion preventing layer for preventing heat energy lost from the chalcogenide material layer 707 via the plug 705 to be described next.

Unfortunately, the technique disclosed therein adopts the tunnel current method in which an electric current passes through a wide-gap insulating layer, and hence must control the very thin insulating layer and high electrical resistivity. This poses a new problem of the difficulty in manufacturing technique.

Also, another problem concerning heat diffusion (thermal energy diffusion) that occurs from the chalcogenide material layer 707 via the plug 705 arises. The material of the plug 705 is, for example, a refractory metal such as tungsten having a low electrical resistivity. However, a high thermal conductivity as the original property of a metal having a low electrical resistivity causes heat diffusion during the set-reset transition. In particular, thermal energy lost from the chalcogenide material layer 707 via the plug 705 during amorphization (the reset transition) requires a large electric current. To solve this problem, $TiO_xN_y$, $TiSi_xN_y$, $TiAl_xN_y$, $TiO_xN_y$, $TaAl_xN_y$, $TaSi_xN_y$, and $TaO_xN_y$ have been proposed as the adhesion promoting layer 711 (patent reference 5). However, the thermal conductivity is still as high as 0.1 W/cmK. That is, the problem that the thermal conductivity is higher than that of the chalcogenide material layer 707 or lower insulating layer 704 of the phase-change memory element remains unsolved.

Patent reference 1: Japanese Patent Laid-Open No. 2006-352082
Patent reference 2: Japanese Patent Laid-Open No. 2003-174144
Patent reference 3: U.S. Pat. No. 3,271,591
Patent reference 4: U.S. Pat. No. 3,530,441
Patent reference 5: U.S. Pat. No. 7,023,008
Patent reference 6: U.S. Pre-Grant Publication No. 2006/0113573
Patent reference 7: U.S. Pre-Grant Publication No. 2004/0195613
Patent reference 8: U.S. Pre-Grant Publication No. 2004/0026731
Non-patent reference 1: Wakiya et al., Thin Solid Films, vol. 410, pp 114, 2002
Non-patent reference 2: Yang et al., Applied Phisics Letters, vol. 66, pp 2643, 1995
Non-patent reference 3: Technical Report of IEICESDM, vol. 106, no. 593, pp 1-6

DISCLOSURE OF INVENTION

Problems that the Invention is to Solve

Unfortunately, the problems such as the power consumption caused by adhesion between the chalcogenide material layer and insulating layer and heat diffusion from the plug to the chalcogenide material layer, the operating speed related to the electrical resistivity, and the difficulty in manufacturing technique of the very thin insulating layer still remain unsolved, and demands have arisen for further improvements.

Means of Solving the Problems

It is an object of the present invention to provide a phase-change memory element having a perovskite layer (oxide layer) that is formed by a material having a perovskite structure having both high electrical conduction properties and high heat insulation properties, and replaces a very thin insulating layer used to promote adhesion between a chalcogenide material layer and lower insulating layer, and a phase-change memory cell including the phase-change memory element.

It is another object of the present invention to provide a vacuum processing apparatus capable of manufacturing a phase-change memory element or phase-change memory cell, and a method of manufacturing, for example, a phase-change memory element, which reduce the difficulty in manufacture of the perovskite layer (oxide layer).

A phase-change memory element according to the present invention which solves at least one of the above objects includes:
a perovskite layer formed by a material having a perovskite structure, and
a phase-change recording material layer which is positioned on at least one side of the perovskite layer, and changes a phase to one of a crystal state and an amorphous state when supplied with an electric current via the perovskite layer.

A phase-change memory cell according to the present invention includes:
the phase-change memory element described above,
a control circuit configured to heat a phase-change recording material layer forming the phase-change memory element to a desired temperature, and
an electrical conductive member which electrically connects the control circuit and the phase-change recording material layer via a perovskite layer forming the phase-change memory element.

A vacuum processing apparatus according to the present invention includes:
a perovskite layer formation chamber which forms a perovskite layer on a substrate by using a material having a perovskite structure, and
a phase-change recording material layer formation chamber which forms, on the perovskite layer formed in the perovskite layer formation chamber, a phase-change recording material layer configured to change a phase to one of a crystal state and an amorphous state.

A phase-change memory element manufacturing method according to the present invention includes:
a perovskite layer formation step of forming a perovskite layer by using a material having a perovskite structure, and
a phase-change recording material layer formation step of forming a phase-change recording material layer which is positioned on at least one side of the perovskite layer, and changes a phase to one of a crystal state and an amorphous state when supplied with an electric current via the perovskite layer.

The present invention makes it possible to provide a phase-change memory element having a perovskite layer (oxide layer) formed by a material having a perovskite structure having both high electrical conduction properties and high heat insulation properties, and a phase-change memory cell including the phase-change memory element.

Also, the present invention makes it possible to provide a vacuum processing apparatus and a method of manufacturing, for example, a phase-change memory element, which reduce the difficulty in manufacture of the perovskite layer (oxide layer).

BRIEF DESCRIPTION OF DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Preferred embodiments of the present invention will be exemplarily explained in detail below with reference to the accompanying drawings. However, constituent elements described in these embodiments are merely examples, and the technical scope of the present invention is determined by the scope of the appended claims and is not limited to the following individual embodiments.

First Embodiment

Figure 1:
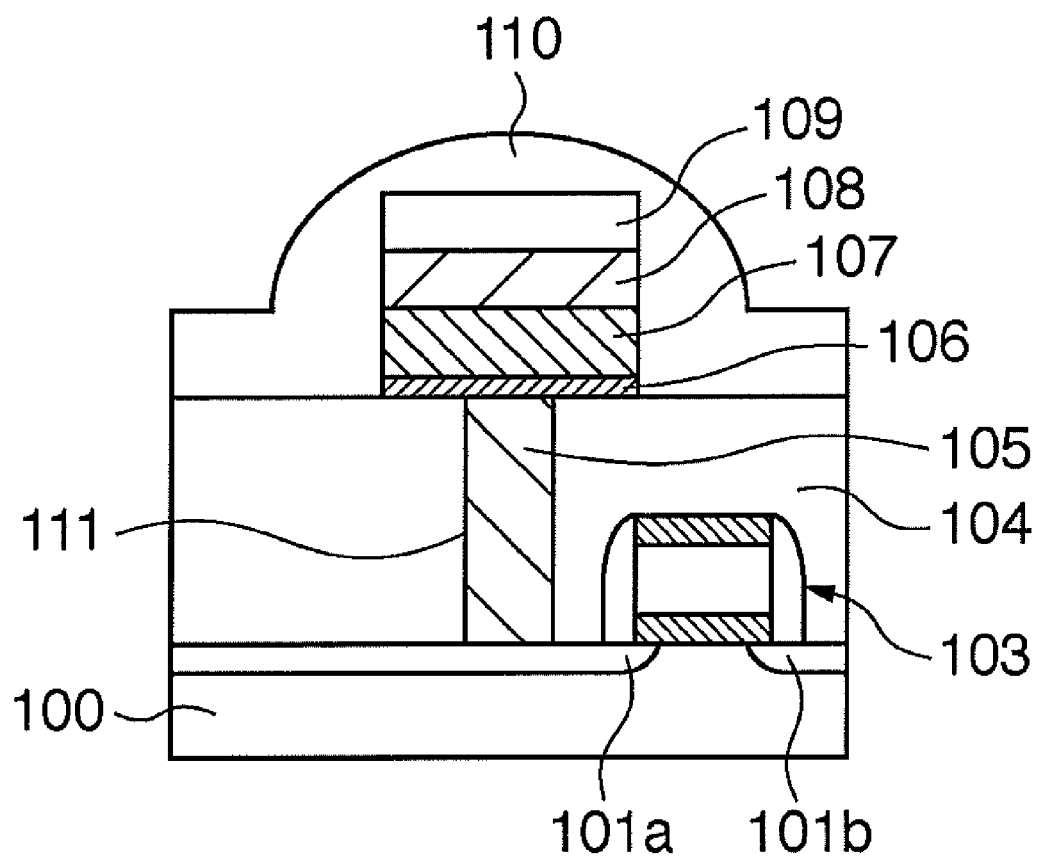
FIG. 1 is an exemplary view showing the structure of a phase-change memory cell in which an oxide layer is inserted between a lower insulating layer and chalcogenide material layer in the first embodiment of the present invention.
Figure 12:
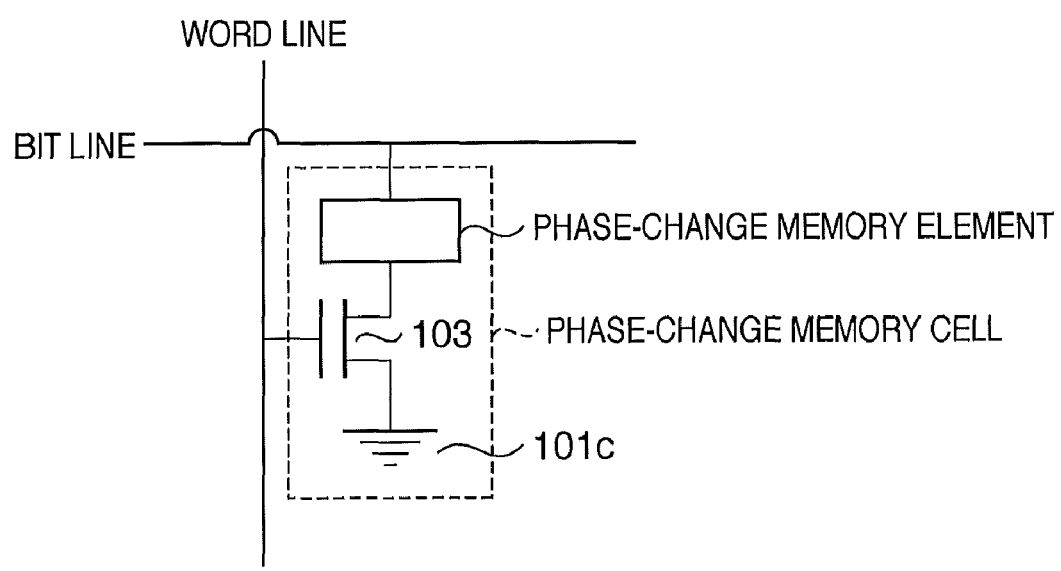
FIG. 12 is a circuit diagram showing a phase-change memory cell.

FIG. 1 is a view exemplarily showing the structure of main components of a phase-change memory cell according to the first embodiment of the present invention. FIG. 12 exemplarily shows a circuit diagram of the phase-change memory cell forming a RAM. For example, the RAM is formed by arranging phase-change memory cells at the intersections of a plurality of word lines and a plurality of bit lines. Referring to FIG. 12, each phase-change memory cell has a phase-change memory element and selection transistor 103. When forming the phase-change memory cell, the selection transistor 103 having a drain 101a and source 101b is formed on the surface of a substrate 100 by well-known techniques. The selection transistor 103 functions as a control means capable of heating a chalcogenide material layer 107 (phase-change recording material layer) forming the phase-change memory element to a desired temperature. Although a MOSFET is used in this embodiment, a bipolar transistor may also be used. Note that interconnections of a reference electrode 101c and the like are not shown in FIG. 1.

Then, a lower insulating layer 104 is formed on the substrate 100 on which the selection transistor 103, drain 101a, and source 101b are formed. A first hole 111 is formed through the lower insulating layer 104, and a material having high electrical conduction properties, such as titanium nitride or tungsten, is buried as a plug 105 in the first hole 111. The plug 105 extends through the lower insulating layer 104, and electrically connects the selection transistor 103 and chalcogenide material layer 107.

An example of the chalcogenide material forming the chalcogenide material layer 107 is a material mainly containing S, Se, or Te, or a material mainly containing S, Se, or Te and at least one of Sb and Ge. Among these materials, a material mainly containing Ge, Sb, and Te is preferably used. It is possible and particularly preferably use $Ge_2Sb_2Te_5$.

Subsequently, on the plug 105 and lower insulating layer 104, a perovskite layer 106 (to be also referred to as an "oxide layer 106" hereinafter) formed by a material having a perovskite structure, the chalcogenide material layer 107, an upper electrode layer 108, and a hard mask 109 made of a silicon oxide film or the like are formed in this order. The perovskite layer includes one member selected from the group consisting of $SrLaTiO_3$, $CaYTiO_3$, $CaNdTiO_3$, $LaNiO_3$, $SrCaLaRuO_3$, $NdNiO_3$, $LaBaSnO_3$, $LaTiO_3$, $CaRuO_3$, $CaMoO_3$, $SrRuO_3$, $BaMoO_3$, $CaCrO_3$, $SrMoO_3$, and $SrCoO_3$. The perovskite layer is formed from an oxide target by magnetron sputtering using one of a high-frequency power supply and a pulse power supply.

The oxide layer 106 can be formed by, for example, sputtering by using an oxide target or a combination of an oxide target and metal target. Other examples of the method of forming the oxide layer 106 are physical vapor deposition, chemical vapor deposition, atomic layer deposition, a method of forming an oxide layer by oxidizing a deposited metal compound, and a method of forming an oxide layer by reactive sputtering of a metal compound in an oxygen ambient. In a vacuum processing apparatus and a phase-change memory element manufacturing method using the vacuum processing apparatus (to be described later), the oxide layer 106 can be formed by using one of these methods.

The thickness of the oxide layer 106 is, for example, about 10 nm, and it is well possible to form the oxide layer 106 having this thickness by any of the oxide layer 106 formation methods described above. When compared to that technique of uniformly forming a thin film of 3 nm or less, which is required for a very thin insulating film of the prior art, the difficulty in manufacturing technique is greatly reduced.

The chalcogenide material layer 107 is formed on the perovskite layer 106 (oxide layer 106), and functions as a phase-change recording material layer that changes its phase to the crystal state or amorphous state when heated or cooled via the perovskite layer 106 (oxide layer 106).

Then, the hard mask 109 is used as a mask to micropattern the oxide layer 106, chalcogenide material layer 107, and upper electrode 108 into a predetermined shape by using lithography and etching known as micropatterning techniques.

Finally, an upper insulating layer 110 is formed for electrical insulation of the phase-change memory element. The phase-change memory element of the present invention uses $LaNiO_3$ (to be also simply referred to as "LNO" hereinafter) as the oxide layer 106, and the oxide layer 106 is formed from a target made of $LaNiO_3$ by magnetron sputtering using pulse DC. The pressure is preferably, for example, 0.9 mTorr, and the temperature is preferably 300° C. The thickness of the oxide layer 106 formed under the conditions is 10 nm.

Figure 2:
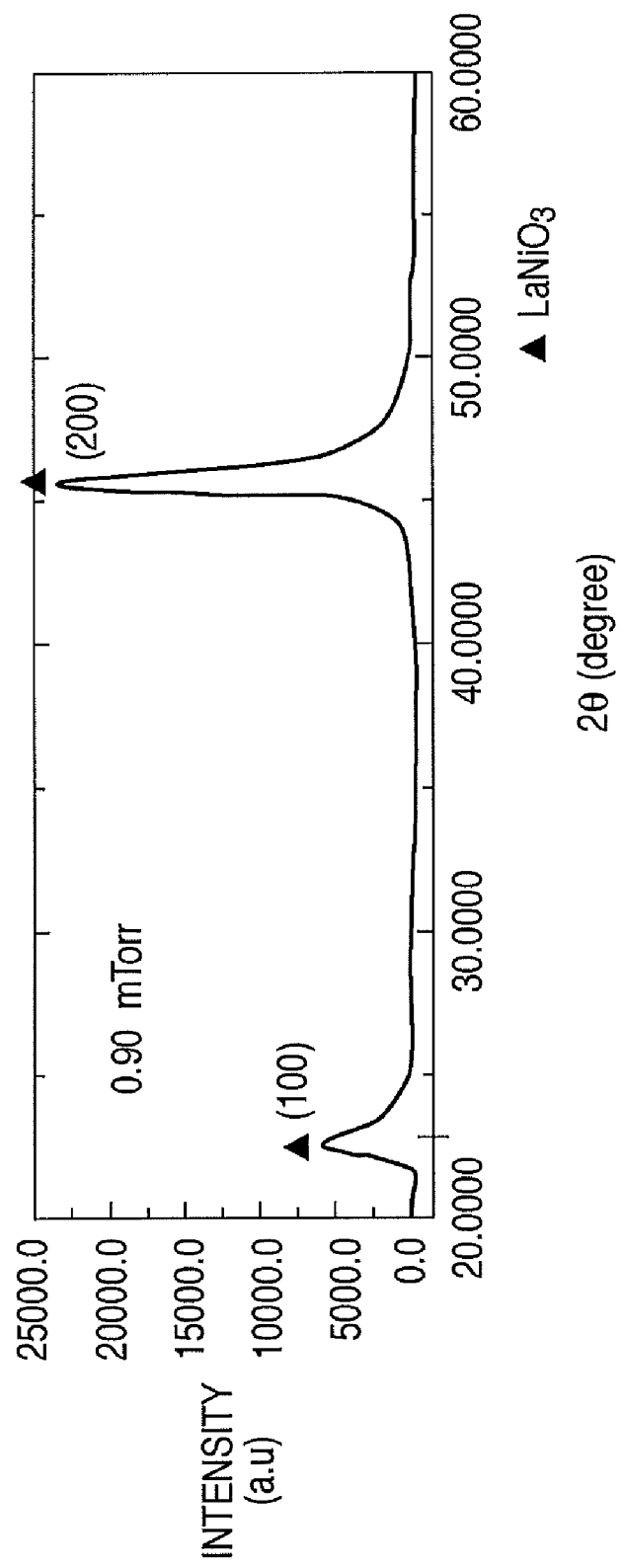
FIG. 2 is an exemplary view showing the result of X-ray diffraction performed on an oxide layer ($LaNiO_3$) of a phase-change memory element according to the first embodiment of the present invention.

FIG. 2 is a view showing the result of measurement performed by X-ray diffraction (the θ-2θ method) on the oxide layer 106 (LNO) of the phase-change memory element according to the first embodiment of the present invention. FIG. 2 reveals that the oxide layer 106 (LNO) has a perovskite structure perpendicular to the film surface and having good (001) orientation. That is, a (200) diffraction peak appearing near 2θ=43° in X-ray diffraction (the θ-2θ method) indirectly shows (001) orientation. As a more direct confirmation method, (001) orientation can be confirmed by observing a sectional image by a transmission electron microscope, and checking the lattice interval. In this method, (001) orientation can be confirmed more clearly by irradiating the oxide layer 106 (LNO) with an electron beam, and analyzing the diffraction pattern.

When the oxide layer 106 (LNO) of the phase-change memory element according to the first embodiment of the present invention was measured by RBS (Rutherford Backscattering Spectroscopy), the oxide layer 106 (LNO) had an atomic ratio of La:Ni:O=19:22:60 close to a stoichiometric of La:Ni:O=20:20:60. Generally, when the atomic ratio of a material is close to the stoichiometric value, the electrical resistance of the material is low. Therefore, the electrical resistance of the oxide layer 106 (LNO) is low.

Table 1 shows the electrical resistivity and thermal conductivity of the oxide layer 106 (LNO) measured by the four-probe resistance measurement method. Note that in Table 1, the electrical resistivity of TiN is $\sim 12 \times 10^{-3}$ (Ωm) for α-TiN and $\sim 5 \times 10^{-3}$ (Ωm) for δ-TiN. For comparison, the characteristics of a very thin insulating layer used in a phase-change memory element obtained by the conventional techniques are shown (patent references 2, 6, and 7, and non-patent references 1 and 2). Table 1 reveals that the oxide layer 106 (LNO) of the phase-change memory element according to the first embodiment of the present invention has a low electrical resistivity of $5 \times 10^{-6}$ (Ωm) or less, and a low thermal conductivity of $2.5 \times 10^{-2}$ (W/cmK) or less.

TABLE 1

| | $LaNiO_3$ | $Ta_2O_5$ | TiN | |
|---|---|---|---|---|
| | | | δ-TiN | α-TiN |
| Electrical resistivity (Ωm) | $\sim 5 \times 10^{-6}$ | $\sim 5 \times 10^{11}$ | $\sim 5 \times 10^{-3}$ | $\sim 12 \times 10^{-3}$ |
| Thermal conductivity (W/cmK) | $\sim 2.5 \times 10^{-2}$ | $\sim 8.5 \times 10^{-2}$ | 0.1~0.3 | |

As described above, the oxide layer 106 (LNO) of the phase-change memory element according to the first embodiment of the present invention has a low electrical resistivity (high electrical conduction properties) and a low thermal conductivity (high heat insulation properties) compared to those of an insulating layer obtained by the conventional techniques.

High heat insulation properties of the oxide layer 106 play an important role as a barrier that prevents heat diffusion from the chalcogenide material layer 107 to the plug, and make it possible to well reduce the power consumption. In addition, a high electrical conductivity of the oxide layer 106 maintains the operating speed while keeping the resistance of the phase-change memory element low. That is, the operating speed does not decrease.

The oxide layer 106 having a high electrical conductivity is independent of the tunneling effect between the oxide layer 106 and chalcogenide material layer 107. Accordingly, the thickness of the oxide layer is not limited, so the oxide layer can be formed thicker than the very thin insulating layer of the prior art. This makes it possible to reduce the difficulty in manufacturing technique by which the insulating layer must be formed so as to be very thin and uniform.

Next, the relationship between the oxide layer 106 (LNO) and chalcogenide material layer 107 when the chalcogenide material layer 107 is formed on the oxide layer 106 (LNO) will be explained below with reference to subfigures 3a to 3e of FIG. 3.

Figure 3:
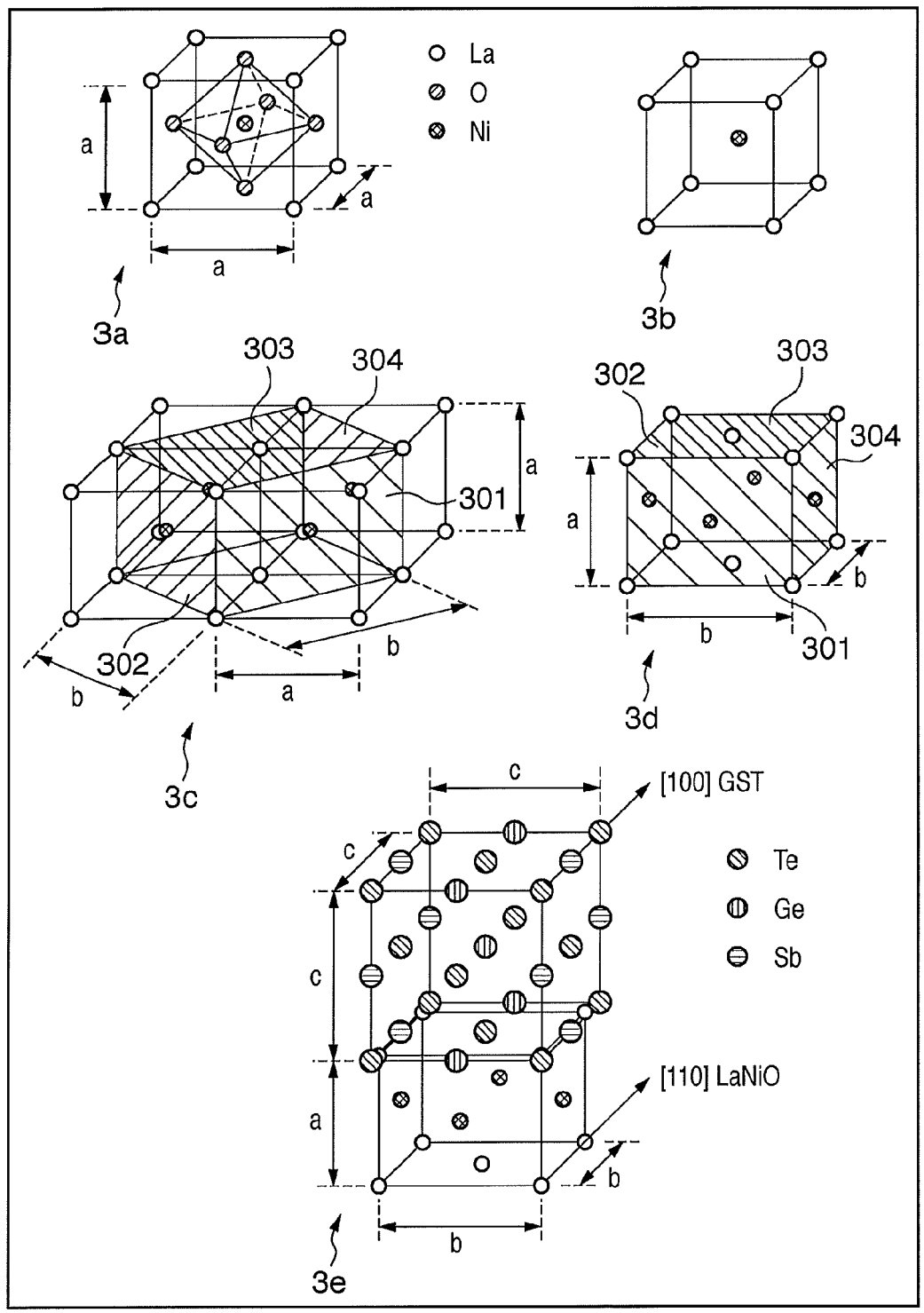
FIG. 3 is an exemplary view showing the relationship between the crystal structure of the oxide layer ($LaNiO_3$) and that of a chalcogenide material layer formed on the oxide layer in the phase-change memory element according to the first embodiment of the present invention.

Subfigure 3a of FIG. 3 is an exemplary view showing that the oxide layer 106 (LNO) has a perovskite structure. It is known that an interlattice distance a of La is 0.384 nm.

Subfigure 3b of FIG. 3 is an exemplary view showing a crystal structure in which oxygen atoms (O) are omitted from the oxide layer 106 (LNO) having the perovskite structure shown in subfigure 3a of FIG. 3, for the convenience of the following explanation.

Subfigure 3c of FIG. 3 is an exemplary view showing a state in which a plurality of crystals of the oxide layer 106 (LNO) having the perovskite structure shown in subfigure 3b of FIG. 3 are combined.

Subfigure 3d of FIG. 3 is an exemplary view showing only a portion surrounded by planes 301, 302, 303, and 304 shown in subfigure 3c of FIG. 3. As shown in subfigure 3c of FIG. 3, an interlattice distance b of La is 0.543 nm obtained by multiplying the distance a by √2. It is also obvious that the exemplary view of the oxide layer 106 (LNO) shown in subfigure 3d of FIG. 3 is obtained by rotating the exemplary view of the oxide layer 106 (LNO) shown in subfigure 3c of FIG. 3 through 45°.

Subfigure 3e of FIG. 3 is an exemplary view showing a structure in which the chalcogenide material layer 107 is formed on the oxide layer 106 (LNO) shown in subfigure 3d of FIG. 3. It is known that an interlattice distance c of Te of the chalcogenide material layer 107 is 0.59 nm. The value of the interlattice distance c of Te is close to 0.543 nm as the interlattice distance b of La of the oxide layer 106 (LNO) shown in subfigure 3e of FIG. 3. This indicates that the chalcogenide material layer 107 readily grows on the oxide layer 106 (LNO) and strongly adheres to it.

From the foregoing, the chalcogenide material layer 107 (GST) has crystal orientation (001) [100], that is, crystallizes by rotating the crystal orientation (001) [110] of the oxide layer 106 (LNO) as a template through 45°. Thus, the oxide layer 106 (LNO) having the perovskite structure shown in FIG. 3 is a good template for the chalcogenide material layer 107 having the rock salt structure.

The chalcogenide material layer 107 is formed on the oxide layer 106 as the crystal orientation of the chalcogenide material layer 107 is crystallized by using the crystal orientation of the oxide layer 106 as a template. This promotes the connection (contact) between the chalcogenide material layer 107 and lower insulating layer 104 via the oxide layer 106. This also promotes the connection (contact) between the chalcogenide material layer 107 and plug 105 via the oxide layer 106.

In this embodiment as explained above, it is possible to provide a phase-change memory element having a perovskite layer (oxide layer) formed by a material having a perovskite structure having both high electrical conduction properties and high heat insulation properties, and a phase-change memory cell having the phase-change memory element.

Second Embodiment

Figure 4:
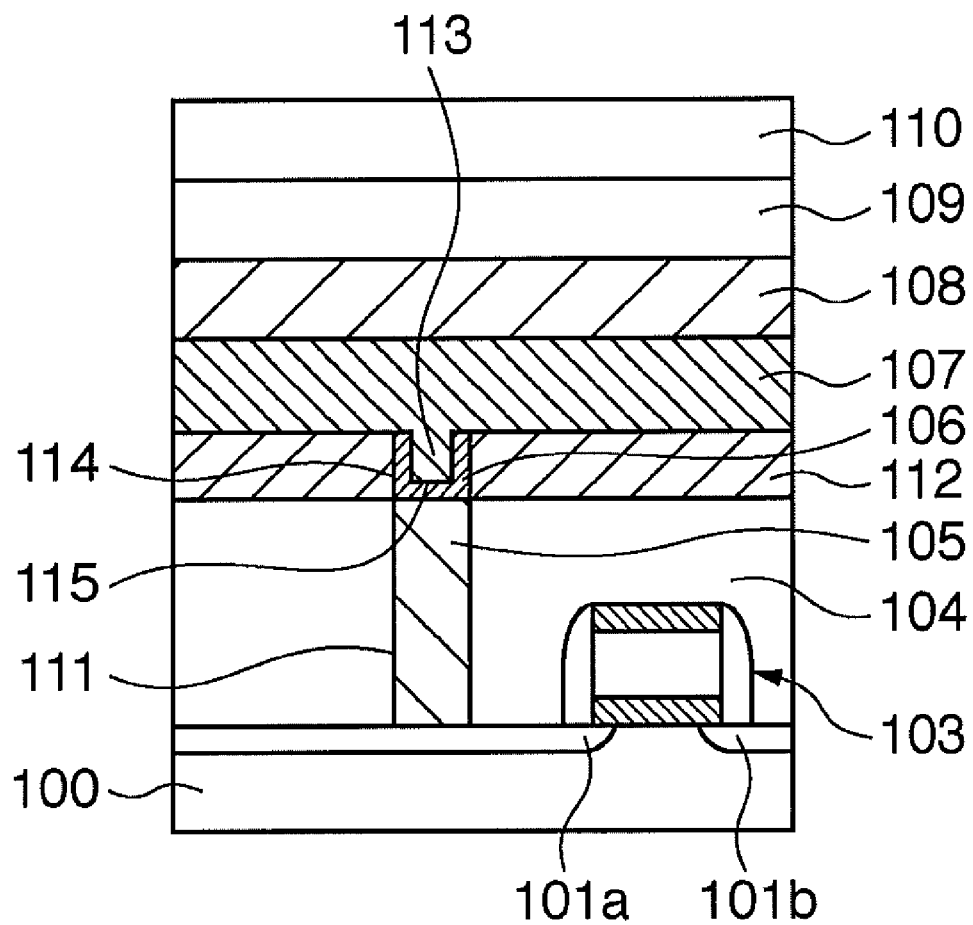
FIG. 4 is an exemplary view showing the structure of a phase-change memory cell in which the interior of a hole formed above a plug is coated with an oxide layer in the second embodiment of the present invention.
Figure 5:
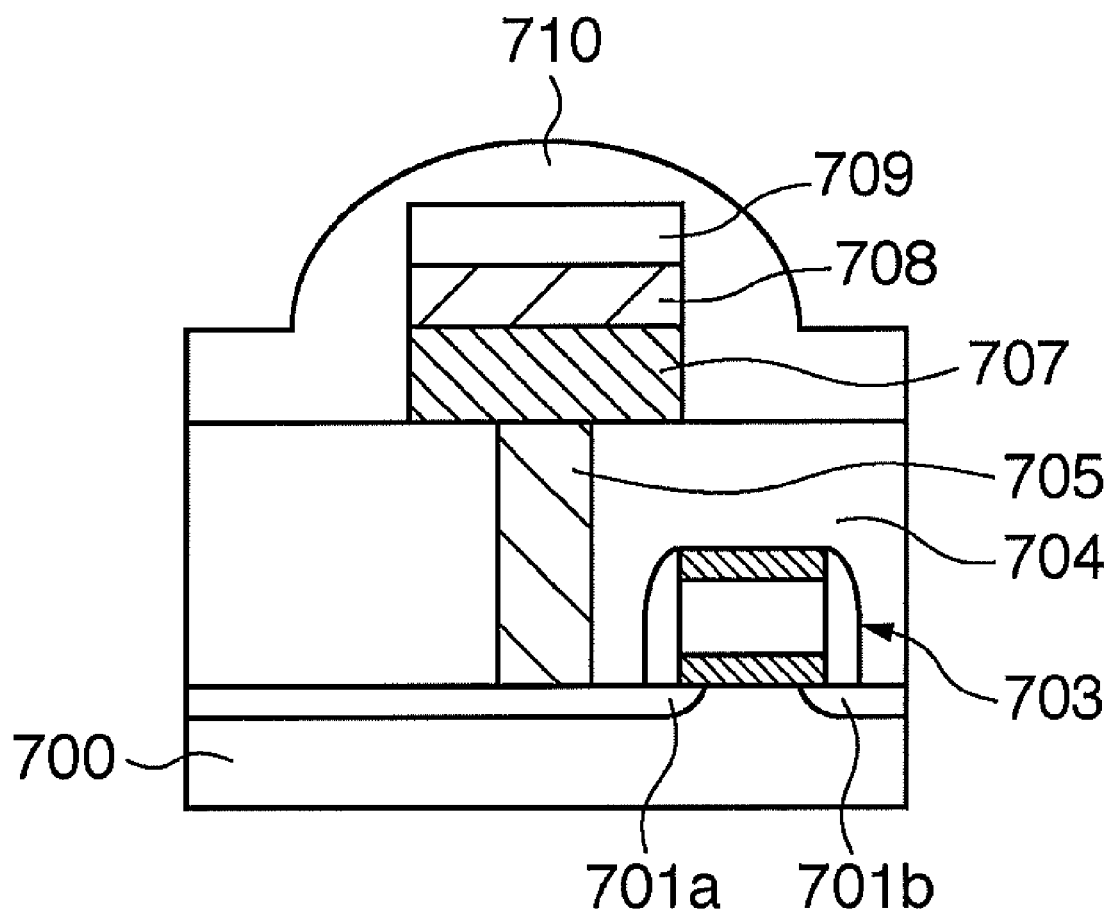
FIG. 5 is an exemplary view showing the set state of the structure of a phase-change memory cell in which a chalcogenide material layer is directly formed on a lower insulating layer in prior art.
Figure 6:
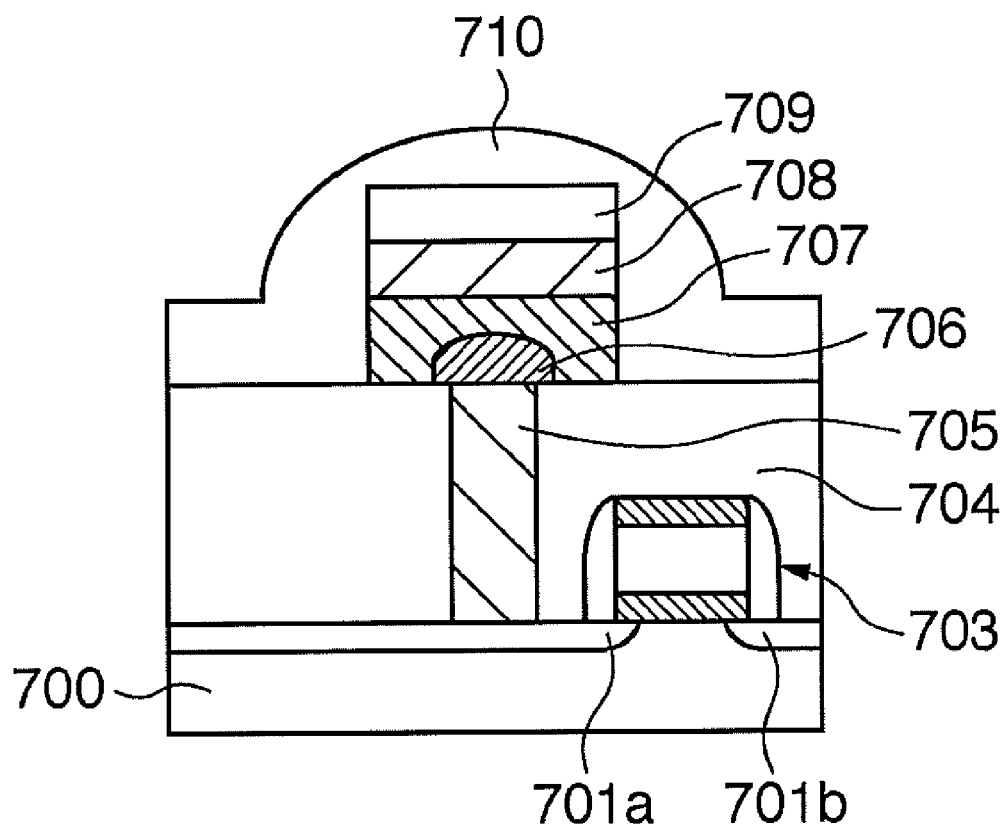
FIG. 6 is an exemplary view showing the reset state of the structure of the phase-change memory cell in which the chalcogenide material layer is directly formed on the lower insulating layer in the prior art.
Figure 7:
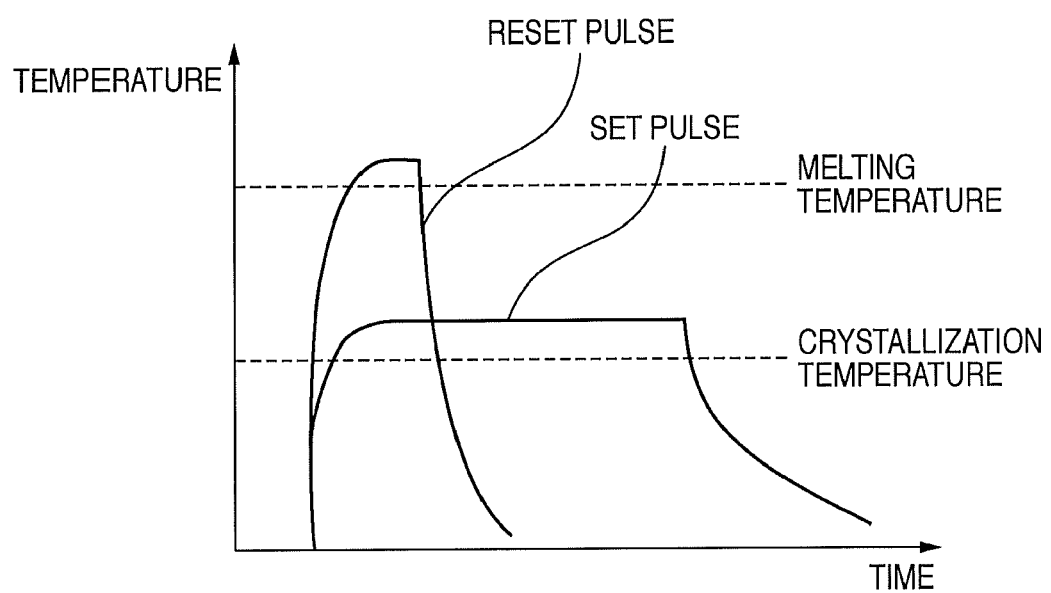
FIG. 7 is an exemplary view showing the relationship between the time of an electrical pulse and the temperature when the chalcogenide material layer changes to the crystal phase and amorphous phase in the prior art.
Figure 8:
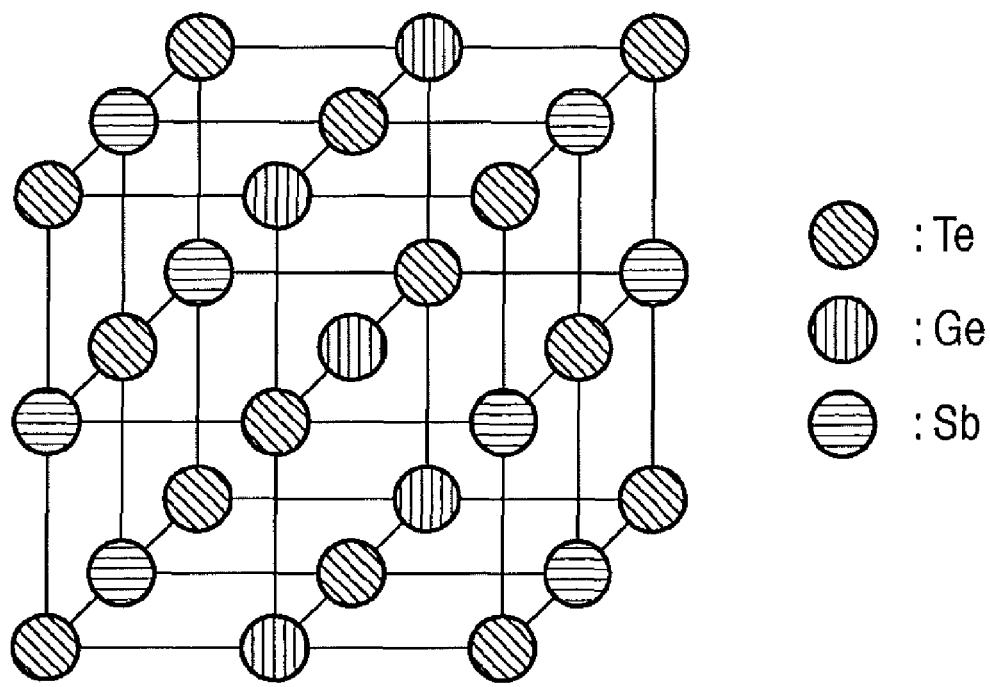
FIG. 8 is an exemplary view showing the crystal structure of GST of a chalcogenide material in the prior art.
Figure 9:
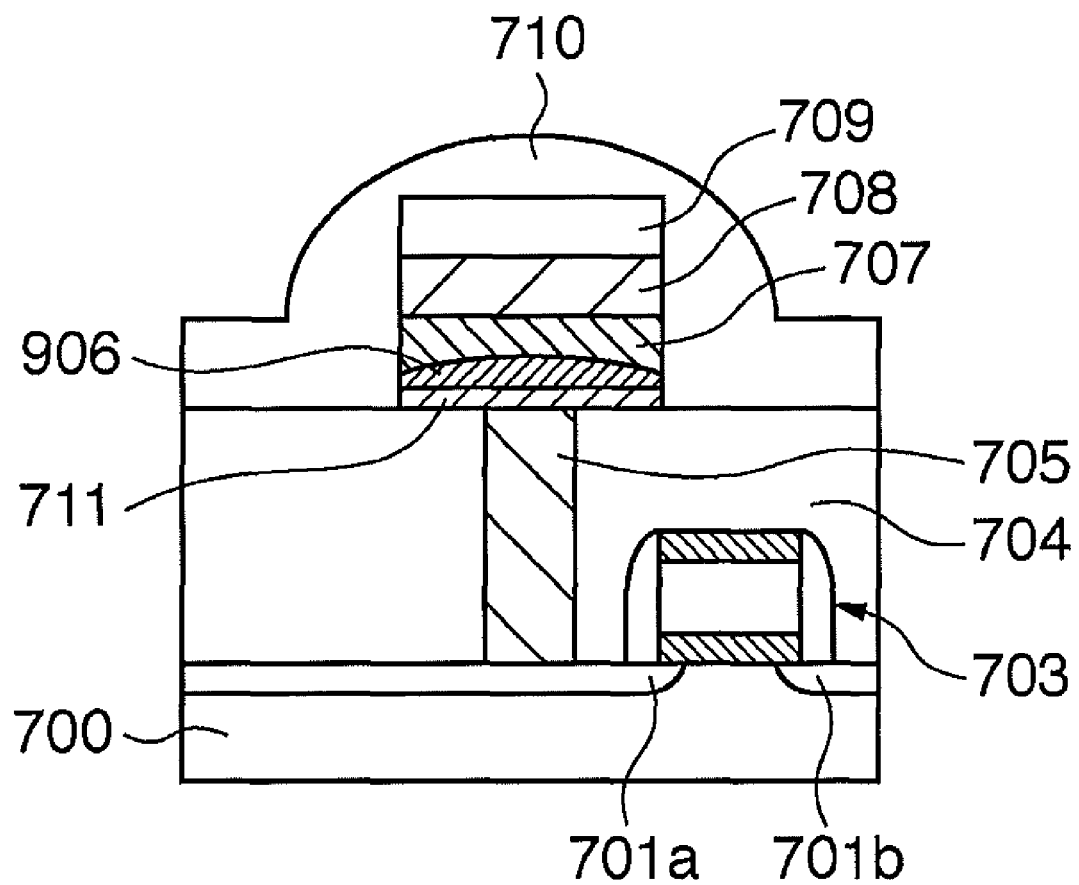
FIG. 9 is an exemplary view showing that the front surface of the chalcogenide material layer is amorphized in the reset state of the structure of the phase-change memory cell in which the chalcogenide material layer is directly formed on the lower insulating layer in the prior art.

FIG. 4 is an exemplary view showing the structure of a phase-change memory element according to the second embodiment of the present invention. The same reference numerals as in the first embodiment denote the same parts, and a detailed explanation will be omitted. The second embodiment differs from the first embodiment in the structure of an oxide layer 106, so this point will be explained below. In the second embodiment, the oxide layer 106 covers walls 114 and a bottom 115 of a second hole 113 formed in an intermediate insulating layer 112 above a plug 105. A chalcogenide material layer 107 is formed to fill the second hole 113 covered with the oxide layer 106, and an upper electrode layer 108 is formed on the chalcogenide material layer 107. In the phase-change memory element according to the second embodiment, the size of the second hole 113 determines electric power required when the chalcogenide material layer 107 changes between the crystal phase and amorphous phase.

Note that although not shown, the oxide layer 106 may also be directly connected to a drain 101a, instead of the structure shown in FIG. 4.

In this embodiment as explained above, it is possible to provide a phase-change memory element having a perovskite layer (oxide layer) formed by a material having a perovskite structure having both high electrical conduction properties and high heat insulation properties, and a phase-change memory cell including the phase-change memory element.

Third Embodiment

As the third embodiment of the present invention, a vacuum processing apparatus for manufacturing the phase-change memory elements explained in the first and second embodiments and a phase-change memory element manufacturing method will be explained below with reference to FIGS. 10 and 11.

Figure 10:
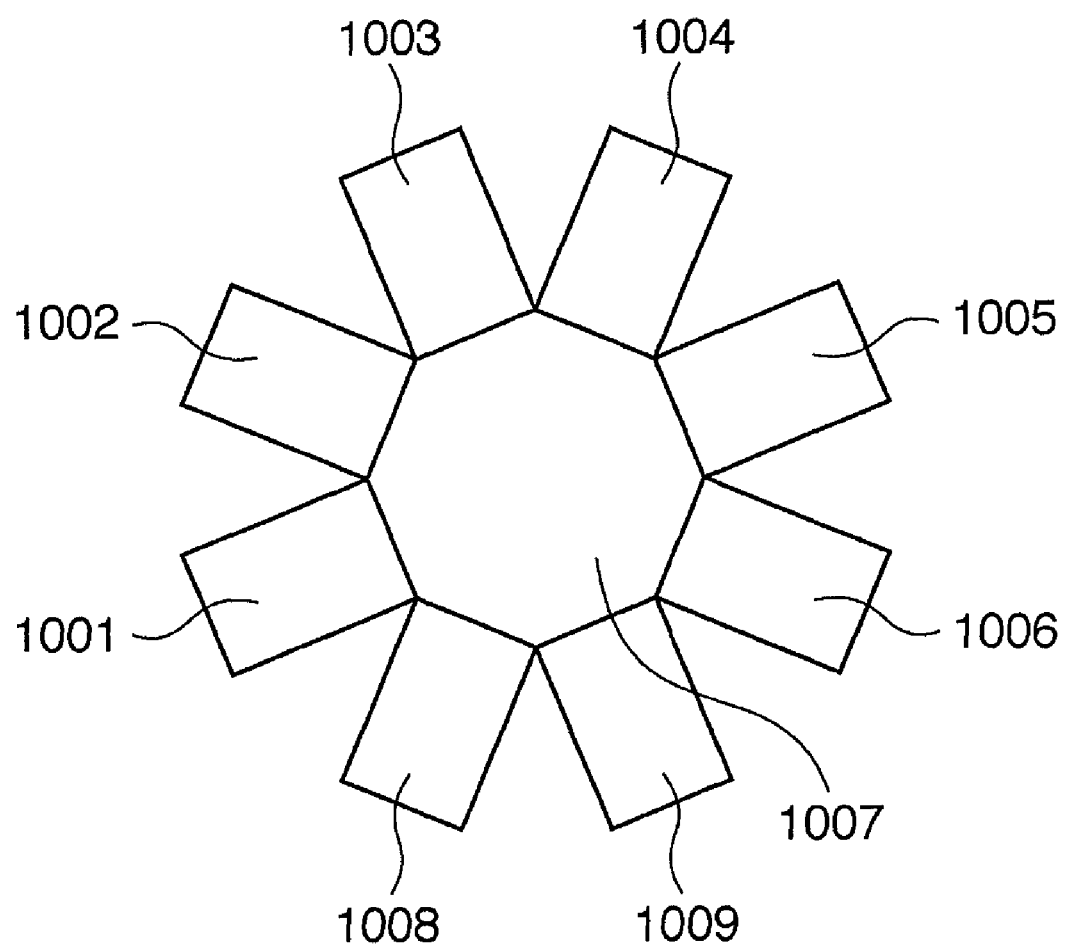
FIG. 10 is an exemplary plan view showing the structure of a vacuum processing apparatus for manufacturing a phase-change memory cell according to the third embodiment of the present invention.
Figure 11:
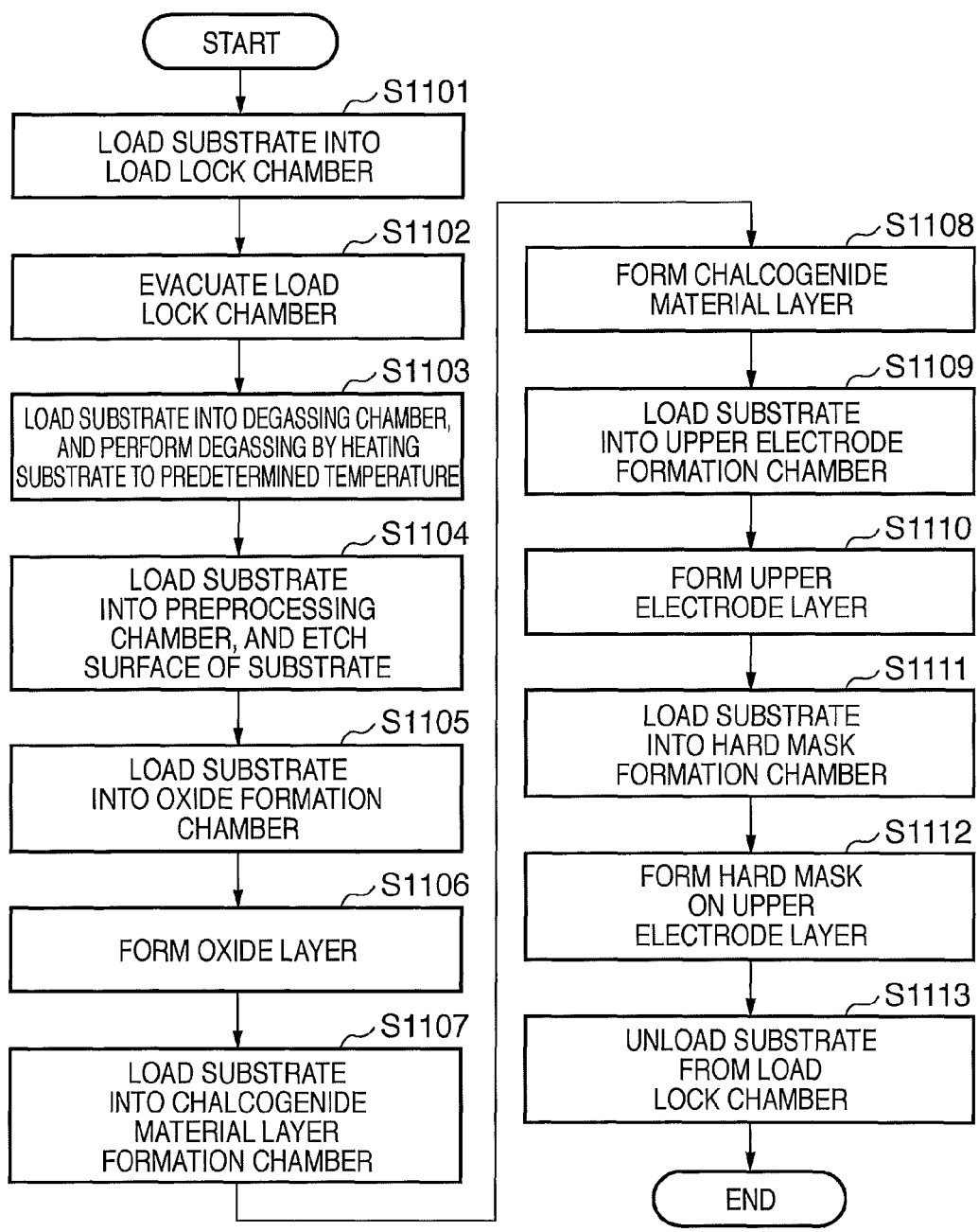
FIG. 11 is a view for explaining the process of a phase-change memory element manufacturing method according to the third embodiment of the present invention.

FIG. 10 is a plan view exemplarily showing the arrangement of a vacuum processing apparatus. The vacuum processing apparatus shown in FIG. 10 is a multi-chamber type apparatus obtained by connecting a plurality of chambers. A substrate 100 is loaded and unloaded by two load lock chambers 1008 and 1009. Preprocessing for cleaning the surface of the substrate 100 is performed in a preprocessing chamber 1001. A hard mask is formed in a hard mask formation chamber 1002. An upper electrode is formed in an upper electrode formation chamber 1003. A chalcogenide material layer is formed in a chalcogenide material layer formation chamber 1004. An oxide layer is formed in an oxide layer formation chamber 1005. Processing for degassing the substrate is performed in a degassing chamber 1006.

The preprocessing chamber 1001, hard mask formation chamber 1002, upper electrode formation chamber 1003, chalcogenide material layer formation chamber 1004, oxide layer formation chamber 1005, and degassing chamber 1006 will generically be called processing chambers (1001 to 1006).

The vacuum processing apparatus further includes a core chamber 1009 for connecting the processing chambers (1001 to 1006) for performing predetermined processes on the substrate 100 and the load lock chambers 1007 and 1008. Gate valves (not shown) that isolate the individual chambers and can be opened and closed as needed are formed between the core chamber 1009 and load lock chambers 1007 and 1008 and between the core chamber 1009 and processing chambers (1001 to 1006).

The two load lock chambers 1007 and 1008 are installed in order to load and unload substrates in parallel by alternately using the two chambers, thereby increasing productivity.

The preprocessing chamber 1001 includes, for example, a substrate table for placing a substrate on it, an evacuating means, a gas supply means, and a power supply means, but these components are not shown. The processing chambers from the hard mask formation chamber 1002 to the oxide layer formation chamber 1005 each include, for example, a substrate table for placing a substrate on it, a target table installed opposite to the substrate table, a target placed on the target table, an evacuating means, a gas supply means, and a power supply means, but these components are not shown. The degassing chamber 1006 includes, for example, a substrate table for placing a substrate on it, an evacuating means, a gas supply means, and a substrate heating means, but these components are not shown. The core chamber 1009 includes, for example, an evacuating means and a substrate transfer means for transferring a substrate, but these components are also not shown.

The procedure of the phase-change memory element manufacturing method will now be explained. FIG. 11 is a view for explaining the procedure of the phase-change memory element manufacturing method. This process can be executed by using the vacuum processing apparatus shown in FIG. 10. Assume that a selection transistor 103, lower insulating layer 104, and plug 105 are formed in previous steps on the surface of a substrate 100 to be loaded into the vacuum processing apparatus.

First, in step S1101, a substrate transfer means (not shown) installed on the atmosphere side loads the substrate 100 into the load lock chamber 1008.

Then, in step S1102, an evacuating means of the load lock chamber 1008 evacuates the load lock chamber 1008 to a predetermined vacuum degree.

Subsequently, in step S1103, the substrate transfer means of the core chamber 1009 loads the substrate into the degassing chamber 1006 from the load lock chamber 1008, and places the substrate on the substrate table. After that, the evacuating means evacuates the degassing chamber 1006.

The substrate heating means heats the substrate to a predetermined temperature, thereby performing a degassing process.

In step S1104, the substrate transfer means of the core chamber 1009 loads the substrate into the preprocessing chamber 1001 from the degassing chamber 1006, and places the substrate on the substrate table. After that, the evacuating means evacuates the preprocessing chamber 1001, and the surface of the substrate is etched by executing the well-known etching technique and cleaned.

In step S1105, the substrate transfer means of the core chamber 1009 loads the substrate into the oxide layer formation chamber 1005 (perovskite layer formation chamber 1005) from the preprocessing chamber 1001, and places the substrate on the substrate table. After that, the evacuating means evacuates the oxide layer formation chamber 1005.

In step S1106, the gas supply means controls a predetermined gas at a predetermined flow rate, and supplies the gas into the oxide layer formation chamber 1005 (perovskite layer formation chamber 1005). The power supply means supplies electric power to the target, thereby causing plasma discharge in the oxide layer formation chamber 1005 (perovskite layer formation chamber 1005). An oxide layer is formed when sputtering particles sputtered from the target reach the surface of the substrate.

In step S1107, the substrate transfer means of the core chamber 1009 loads the substrate into the chalcogenide material layer formation chamber 1004 from the oxide layer formation chamber 1005 (perovskite layer formation chamber 1005), and places the substrate on the substrate table. After that, the evacuating means evacuates the chalcogenide material layer formation chamber 1004.

In step S1108, the gas supply means controls a predetermined gas at a predetermined flow rate, and supplies the gas into the chalcogenide material layer formation chamber 1004 (phase-change recording material layer formation chamber 1004). The power supply means supplies electric power to the target, thereby causing plasma discharge in the chalcogenide material layer formation chamber 1004 (phase-change recording material layer formation chamber 1004). A chalcogenide material layer (phase-change recording material layer) is formed on the oxide layer when sputtering particles sputtered from the target reach the surface of the substrate.

In step S1109, the substrate transfer means loads the substrate into the upper electrode formation chamber 1003 from the chalcogenide material layer formation chamber 1004 (phase-change recording material layer formation chamber 1004), and places the substrate on the substrate table. After that, the evacuating means evacuates the upper electrode formation chamber 1003.

In step S1110, the gas supply means controls a predetermined gas at a predetermined flow rate, and supplies the gas into the upper electrode formation chamber 1003. The power supply means supplies electric power to the target, thereby causing plasma discharge in the upper electrode formation chamber 1003. An upper electrode layer is formed on the chalcogenide material layer when sputtering particles sputtered from the target reach the surface of the substrate.

In step S1111, the substrate transfer means of the core chamber 1009 loads the substrate into the hard mask formation chamber 1002 from the upper electrode formation chamber 1003, and places the substrate on the substrate table. After that, the evacuating means evacuates the hard mask formation chamber 1002.

In step S1112, the gas supply means controls a predetermined gas at a predetermined flow rate, and supplies the gas into the hard mask formation chamber 1002. The power supply means supplies electric power to the target, thereby causing plasma discharge in the hard mask formation chamber 1002. A hard mask is formed on the upper electrode layer when sputtering particles sputtered from the target reach the surface of the substrate.

Finally, in step S1113, the substrate having undergone the predetermined processes described above is unloaded from the hard mask formation chamber 1002 and loaded into the load lock chamber 1007 by the substrate transfer means of the core chamber 1009. The substrate is then unloaded from the load lock chamber 1007 and transferred to the subsequent step by the substrate transfer means installed on the atmosphere side.

A phase-change memory cell having a phase-change memory element is formed on the substrate 100 by the processes from step S1101 to step S1113.

In this embodiment as explained above, it is possible to provide a vacuum processing apparatus and a method of manufacturing, for example, a phase-change memory element, which reduce the difficulty in manufacture of a perovskite layer (oxide layer).

The preferred embodiments of the present invention have been explained above with reference to the accompanying drawings. However, the present invention is not limited to these embodiments, and can be changed to various forms within the technical scope grasped from the description of the scope of the appended claims.

The present invention is not limited to the above embodiments, and various changes and modifications can be made without departing from the spirit and scope of the invention. Therefore, to apprise the public of the scope of the present invention, the following claims are appended.

The invention claimed is:

1. A phase-change memory element comprising:
   an insulating layer;
   a perovskite layer adjoining said insulating layer; and
   a phase-change recording material layer which is crystallized on said perovskite layer by using crystal orientation of said perovskite layer as a template,
   wherein said crystal orientation is (001) orientation.

2. The phase-change memory element according to claim 1, wherein said phase-change recording material layer includes a chalcogenide material.

3. The phase-change memory element according to claim 1, wherein said perovskite layer includes one member selected from the group consisting of $SrLaTiO_3$, $CaYTiO_3$, $CaNdTiO_3$, $LaNiO_3$, $SrCaLaRuO_3$, $NdNiO_3$, $LaBaSnO_3$, $LaTiO_3$, $CaRuO_3$, $CaMoO_3$, $SrRuO_3$, $BaMoO_3$, $CaCrO_3$, $SrMoO_3$, and $SrCoO_3$.

4. A phase-change memory cell comprising:
   a phase-change memory element according to claim 1;
   a control circuit configured to heat a phase-change recording material layer forming said phase-change memory element to a desired temperature; and
   an electrical conductive member which electrically connects said control circuit and said phase-change recording material layer via a perovskite layer forming said phase-change memory element.

* * * * *